(12) United States Patent
Ezaki

(10) Patent No.: US 6,381,300 B1
(45) Date of Patent: Apr. 30, 2002

(54) EXPOSURE MASK, EXPOSURE MASK MANUFACTURING METHOD, AND SEMICONDUCTOR DEVICE MANUFACTURING METHOD USING EXPOSURE MASK

(75) Inventor: Mizunori Ezaki, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 48 days.

(21) Appl. No.: 09/652,661

(22) Filed: Aug. 31, 2000

(30) Foreign Application Priority Data

Sep. 30, 1999 (JP) .......................................... 11-280499

(51) Int. Cl.$^7$ ................................................ G21K 5/00
(52) U.S. Cl. .......................................... 378/35; 378/34
(58) Field of Search ..................................... 378/34, 35

(56) References Cited

U.S. PATENT DOCUMENTS

| | | |
|---|---|---|
| 5,124,561 A | 6/1992 | Faure et al. |
| 5,465,220 A | * 11/1995 | Haruki et al. ................ 364/525 |
| 5,781,607 A | * 7/1998 | Acosta et al. ................. 378/34 |

FOREIGN PATENT DOCUMENTS

| | | |
|---|---|---|
| DE | 34 35 178 | 4/1985 |
| DE | 37 03 582 | 4/1988 |
| EP | 0 167 948 | 1/1986 |
| EP | 0 244 496 | 11/1987 |
| EP | 0 266 275 | 5/1988 |
| EP | 0 452 043 | 10/1991 |
| JP | 59 154452 | 9/1984 |
| JP | 4-196211 | 7/1992 |
| JP | 5-090137 | 4/1993 |
| JP | 7-094395 | 4/1995 |

* cited by examiner

Primary Examiner—David V. Bruce
Assistant Examiner—Pamela R. Hobden
(74) Attorney, Agent, or Firm—Oblon, Spivak, McClelland, Maier & Neustadt, P.C.

(57) ABSTRACT

A mask of certain type has a transparent base and a transparent film formed on the transparent base. The transparent film has at least one mask member formed in a predetermined mask pattern and having a relatively low exposure beam transparency. The mask member sometimes has a placement error from a designed placement. This is mainly because an in-plane stress distribution of the transparent film is nonuniformity. The transparent film is partially decreased in thickness to unity the in-plane stress distribution.

20 Claims, 11 Drawing Sheets

Pith(X)=4mm
Pith(Y)=4mm

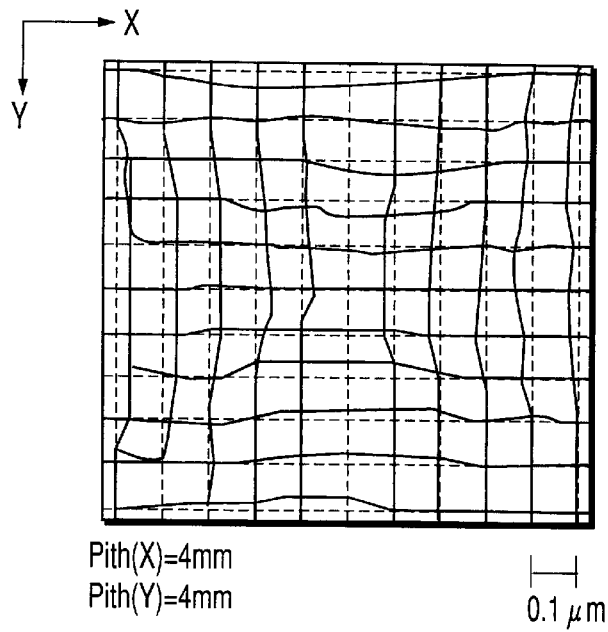
Pith(X)=4mm
Pith(Y)=4mm
F I G. 11A
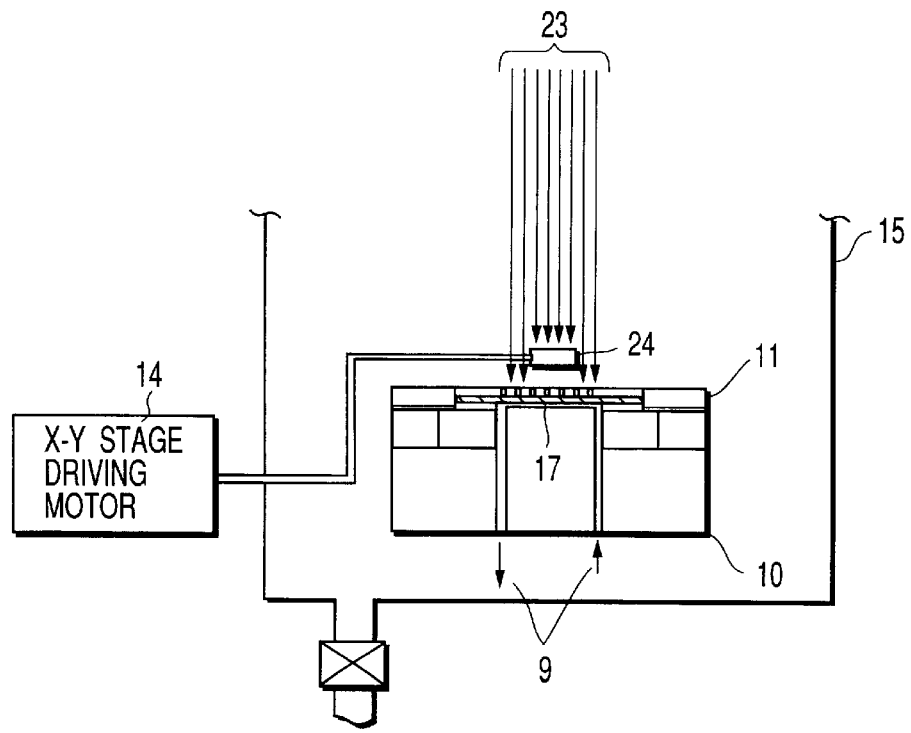
F I G. 11B

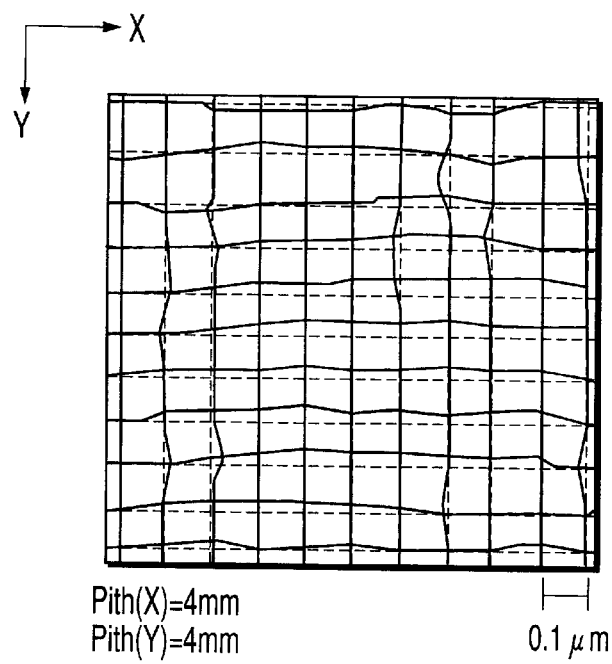
Pith(X)=4mm
Pith(Y)=4mm
0.1 μm
F I G. 12A
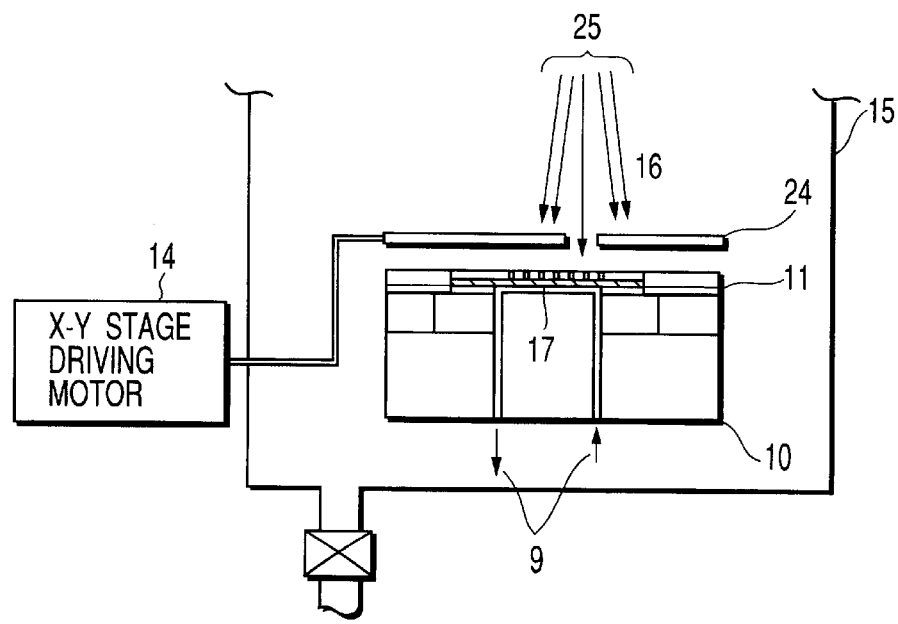
F I G. 12B

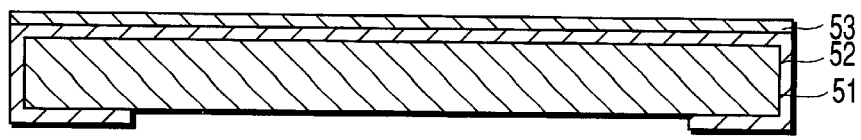
FIG. 13A
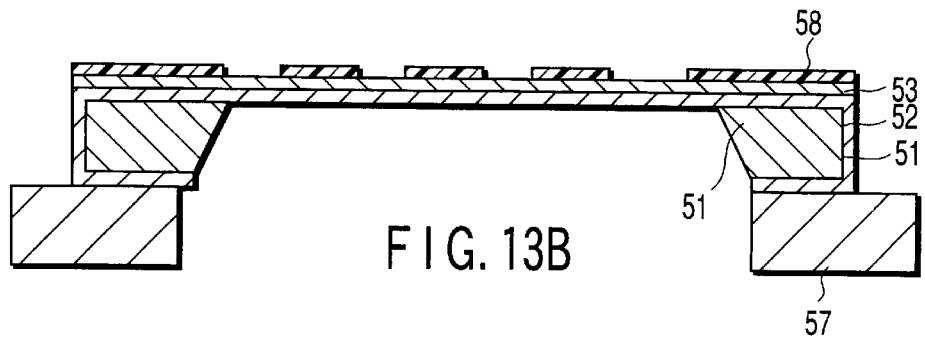
FIG. 13B
FIG. 13C
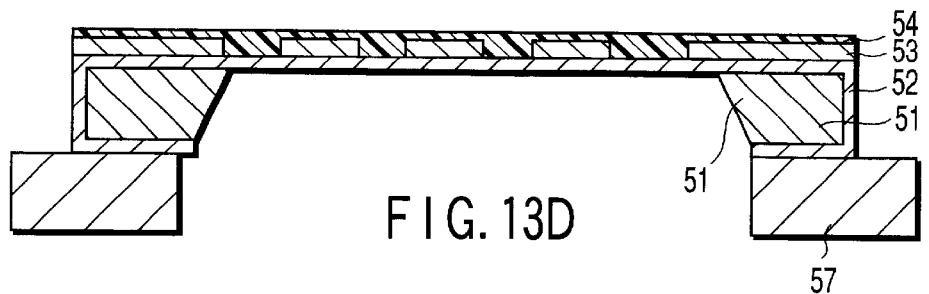
FIG. 13D
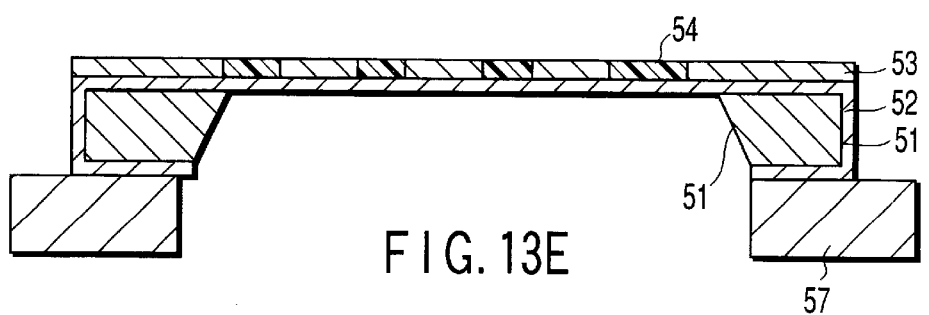
FIG. 13E

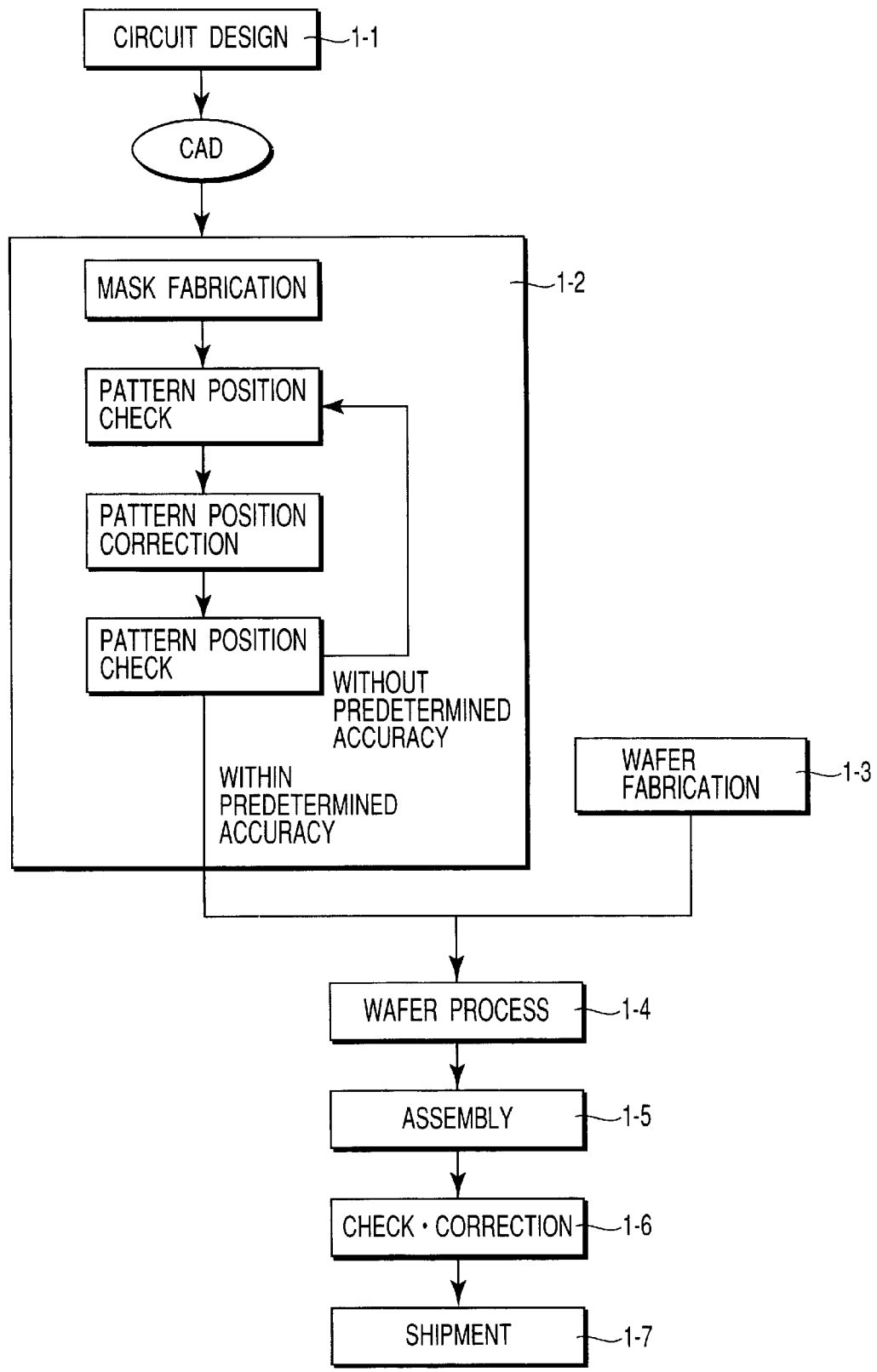
F I G. 14

EXPOSURE MASK, EXPOSURE MASK MANUFACTURING METHOD, AND SEMICONDUCTOR DEVICE MANUFACTURING METHOD USING EXPOSURE MASK

CROSS-REFERENCE TO RELATED APPLICATIONS

This application is based upon and claims the benefit of priority from the prior Japanese Patent Application No. 11-280499, filed Sep. 30, 1999, the entire contents of which are incorporated herein by reference.

BACKGROUND OF THE INVENTION

The present invention relates to an exposure mask suitable for various beam exposure schemes using a charged beam or X-rays and, more particularly, to an exposure mask in which positional distortion of a mask pattern due to internal stress is corrected, and a method of manufacturing the exposure mask.

In recent years, circuit devices represented by LSI devices are rapidly shrinking in feature size, and therefore photolithography currently used as a micropatterning technique on the commercial level will soon become unable to form a minimum line width of several ten nm or less because of its resolution capability limit. Demand has arisen for the development of a microfabrication technique that can take the place of the current photolithography. A candidate that can meet this requirement is lithography using short wavelength VUV (Vacuum Ultra Violet) light, X-rays, or an electron beam.

A 1X X-ray lithography exposure using X-rays irradiates a wafer 33 with X-rays 31 through an X-ray exposure mask 30 with a mask pattern to transfer the mask pattern onto an X-ray resist 32, as shown in FIG. 1. The X-ray exposure mask 30 has a structure having a 1- to 5-$\mu$m thick membrane (X-ray transparent supporting film) 2 made of an element with light weight which transmits X-rays, such as silicon nitride, silicon carbide, silicon, or diamond, and an X-ray absorber pattern 4 formed on the membrane 2 to absorb X-rays, and is supported by a reinforcing frame 7 and Si substrate frame 1. The Si substrate frame 1 is used to minimize distortion in the X-ray absorber pattern 4 because the membrane 2 is very thin and mechanically weak.

To manufacture this X-ray exposure mask, first membrane films are formed on both surfaces of an Si substrate, and an etching stopper & anti-reflection film, X-ray absorber film, and pattern transfer etching hard mask film are formed on one surface. Next, the membrane film on the lower surface side of the Si substrate is removed by etching, the Si substrate at the opening portion is removed by back etching, and the Si substrate frame is reinforced by bonding a reinforcing frame. Then, a resist pattern is formed by electron beam exposure and development, the pattern transfer etching hard mask film is etched, and the resist is removed. Finally, the X-ray absorber film is etched, and the pattern transfer etching hard mask is removed to form an X-ray absorber pattern on the membrane film, thus completing to fabricate an X-ray exposure mask.

The in-plane pattern image placement accuracy of the conventional X-ray exposure mask obtained by the above method is evaluated by measuring displacements (in-plane distortion; IPD) of the formed pattern with respect to a desired pattern using an image placement measurement apparatus (LMS-IPRO available from Leica). As shown in FIG. 2, pattern displacements are observed. Referring to FIG. 2, the broken lines indicate the desired positions, and the solid lines indicate the actually measured positions.

Generated IPD values are 11 nm on average and 43 nm for 3$\sigma$. The maximum displacement amount is 49 nm. The displacements occurred almost in one direction. For example, the overlay accuracy required to realize a 150-nm rule device by X-ray lithography is 50 nm for 1/3 the design rule. If this includes 30 nm as a value allowable for the mask, the pattern accuracy measured above is insufficient.

Required image placement accuracy cannot be obtained probably because each of the resist film, pattern transfer hard mask film, absorber film, membrane film, and etching stopper film, which form the mask, has (1) internal stress, (2) film thickness distribution, and (3) internal stress distribution. The pattern position is displaced in proportion to the difference in the product of film thickness by stress (forces acting inside the film) in each region of films forming the X-ray exposure mask. As examples, FIGS. 3A and 3B show pattern distortions generated by tensile stress and compression stress of the X-ray absorber film, respectively.

When an X-ray absorber pattern is formed from the X-ray absorber film 4 having tensile stress at a desired (resist) pattern position by etching, the absorber pattern position is displaced outward from the center, as shown in FIG. 3A, because internal stress at the etched (removed) portion of the absorber film is released. On the other hand, when the X-ray absorber film has compression stress, the absorber pattern position after etching is displaced toward the central portion, as shown in FIG. 3B, relative to the (resist) pattern at the desired position. If the pattern density changes all over the pattern area, the pattern position is displaced from the desired position in accordance with the pattern density.

In not only the X-ray absorber film but all films forming the mask, if internal stress is present, a displacement from a desired position occurs. Since the pattern position is displaced in proportion to the product of film thickness by stress (forces acting inside the film), the pattern position is largely displaced from the desired position if the film thickness changes in the plane. Even when the film has internal stress distribution, IPD occurs.

In the conventional X-ray exposure mask manufacturing, mainly, the materials and processes are optimized to uniform the in-plane distribution of internal stress in each film of the mask, and for a film (except the membrane film) formed by etching, internal stress is reduced, thereby suppressing IPD. However, these methods are still poor in film reproducibility and have problems in obtaining a required image placement accuracy.

A method of improving image placement accuracy after mask formation has been proposed in which ions are implanted into a membrane film immediately under a pattern, and film stress is changed using the effect that the ions enter the crystal of the membrane film to increase the lattice spacing, thereby suppressing distortion attributed to an X-ray absorber pattern using the out-plane distortion of the membrane film (Jpn. Pat. Appln. KOKAI Publication No. 4-196211).

Another method of improving image placement accuracy after pattern formation has been proposed in which a membrane film is etched, or ions are implanted into the membrane film to increase/decrease the film thickness or film stress (Jpn. Pat. Appln. KOKAI Publication No. 7-94395). Still another method of improving the pattern accuracy of a mask has been proposed in which a stretchable film is deposited on the lower surface of a mask substrate around the X-ray exposure region, thereby reducing the concave mask distortion to planarize the film (Jpn. Pat. Appln. KOKAI Publication No. 5-90137).

In all of the prior-art techniques, any pattern distortion due to degradation in planarity can be reduced, though fabrication of a considerably uniform membrane film, non-warp frame, and X-ray absorber film controlled to low stress is required, resulting in technical difficulty. Requirements for in-plane uniformity such as film thickness and stress are also severe. When a membrane film is etched, the X-ray transparency largely changes to result in a variation in pattern size. In addition, since the membrane film serves as a supporter, its etching is undesirable from the viewpoint of stability.

An electron beam projection lithography mask using a reduction image projection technique, a SCALPEL (SCattering with Angular Limitation for Projection Electron Lithography) mask, or a stencil mask also has a structure in which an electron scattering pattern is formed on a membrane film, as in the X-ray exposure mask. Requirements for formation of a low-stress thin film and in-plane uniformity such as film thickness and stress are severe, and prior-art techniques have the same technical difficulty as in the X-ray exposure mask.

As described above, for the conventional X-ray exposure mask and electron beam exposure mask, to attain the image placement accuracy required for a micropattern with a minimum line width of several ten nm or less, each thin film of the mask is required to have values and uniformity that are very hard to achieve as physical properties including film stress, film stress in-plane uniformity, and film thickness. For this reason, it is difficult to realize a highly precise exposure mask which can use for further shrinking in feature size of a circuit device in the future.

BRIEF SUMMARY OF THE INVENTION

It is an object of the present invention to provide an exposure mask which can accurately correct positional distortion due to internal stress of an X-ray absorber pattern or electron scattering pattern and has a high pattern accuracy to sufficiently use for shrinking in feature size in the future.

An exposure mask is formed by forming a mask layer on a transparent supporting layer (membrane film layer) having a relatively high exposure beam transparency. A mask layer of certain type has a transparent film having a relatively high exposure beam transparency and a mask pattern embedded in the transparent film and having a relatively low exposure beam transparency. The mask pattern sometimes has a positional error from a designed pattern. This is mainly because an in-plane stress distribution of the transparent film is nonuniform. This nonuniformity of the stress distribution is reduced by at least one stress adjusting portion to correct the positional error. Especially, when the stress adjusting portion is formed not on the transparent supporting film (membrane film) but on the transparent film, various advantages can be acquired.

As the stress adjusting portion, one of a cut portion obtained by partially cutting the transparent film, a transparent portion partially deposited on the transparent film, and a portion obtained by physically or chemically changing the transparent film is used.

Additional objects and advantages of the present invention will be set forth in the description which follows, and in part will be obvious from the description, or may be learned by practice of the present invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrated presently preferred embodiments of the present invention and, together with the general description given above and the detailed description of the preferred embodiments given below, serve to explain the principles of the present invention.

FIGS. 11A and 11B are views showing a pattern position displacement distribution and an ion implantation apparatus used to manufacture an X-ray exposure mask according to the third embodiment to the present invention, respectively;

FIGS. 12A and 12B are views showing a pattern position displacement distribution and a sputtering apparatus used to manufacture an X-ray exposure mask according to the fourth embodiment to the present invention, respectively;

FIGS. 13A to 13E are sectional views showing steps in manufacturing an electron beam exposure mask according to the fifth embodiment to the present invention; and FIG. 14 is a flow chart showing semiconductor device production according to the seventh embodiment of the present invention.

DETAILED DESCRIPTION OF THE INVENTION

Before a description of the embodiments of the present invention, the basic principle of the present invention will be described with reference to FIGS. 4A to 4D. An X-ray exposure mask will be exemplified herein as an exposure mask, though the principle also applies to an electron beam exposure mask.

Figure 4A:
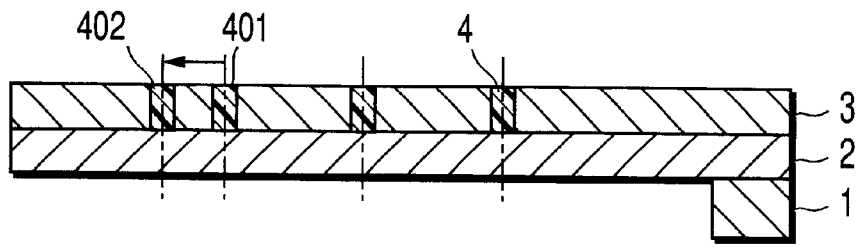
FIGS. 4A to 4D are sectional views for explaining the basic principle of the present invention.

FIG. 4A shows a state before the X-ray exposure mask of the present invention is manufactured. This X-ray exposure mask has an X-ray transparent supporting thin film (membrane film) 2 covered over an Si frame 1, and an X-ray absorber pattern 4 and X-ray transparent film 3 formed on the membrane film 2. The X-ray absorber pattern formed on this X-ray exposure mask is formed at a position 402 displaced from a desired pattern position 401 by the manufacturing step.

Figure 4B:
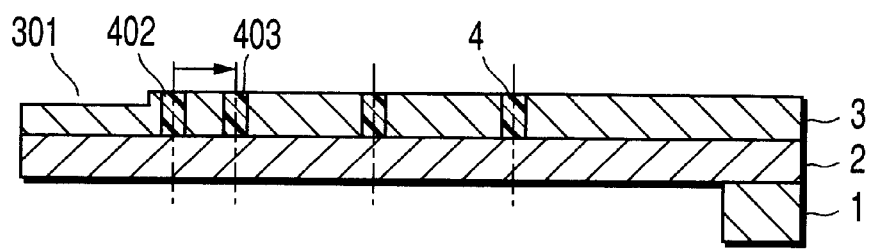

FIG. 4B shows the X-ray exposure mask according to the present invention. The transparent film 3 is partially decreased in thickness to reduce the positional distortion of the X-ray absorber pattern to the desired position. When the portion 301 is formed, a corrected pattern 403 in which the distorted pattern is corrected to the desired position can be obtained.

More specifically, to correct the pattern 402 whose position is to be corrected to the desired position 401, the film thickness of the transparent film 3 near the region of the pattern whose position is to be corrected is decreased by a predetermined amount relative to that of the transparent film 3 in the moving direction. This changes stress distribution acting in the plane of the mask to generate IDP, so the pattern position can be corrected.

Figure 4C:
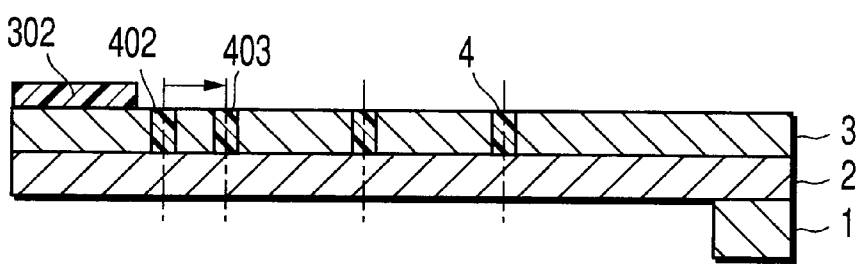

Even when a new transparent film 302 is deposited on part of the transparent film 3 instead of removing part of the transparent film 3, as shown in FIG. 4C, internal stress of the transparent films 3 and 302 near the pattern 402 to be moved can be adjusted. In this case as well, stress distribution acting in the plane of the mask can be changed to generate IPD, so the pattern position can be corrected.

Figure 4D:
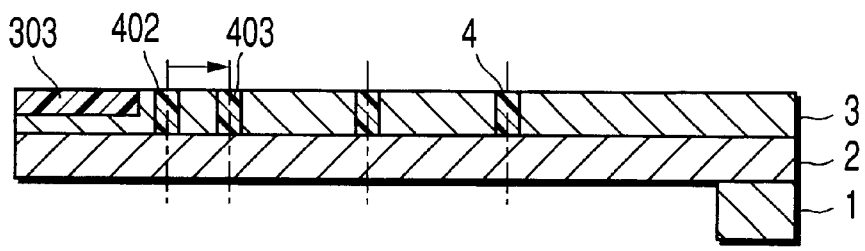

Similarly, as shown in FIG. 4D, to move the pattern 402 whose position is to be corrected to the desired pattern layout position 401, the transparent film 3 in a region and the proximity region 303 of the pattern 402 whose position is to be corrected is formed to have internal stress smaller than the transparent film stress in the moving direction by a predetermined amount. This changes stress distribution acting in the plane of the mask to generate IPD, so the pattern position can be corrected.

Even when a thin film such as an anti-reflection film, etching stopper film, charge-up preventing film, or buffer film is formed on one or both surfaces of the membrane film 2, the pattern whose position is to be corrected can be moved to a desired pattern layout position by the same effects as described above.

These methods of correcting the pattern position are very effective for a structure such as an X-ray exposure mask having a self-supporting film (membrane film) and effective not only for an X-ray exposure mask but also for an electron beam exposure mask for a reduction image projection lithography and Fresnel zone plate. However, when a pattern is formed on a structure that can be regarded as a rigid body, as in a reticle used for conventional photolithography, position correction using a change in stress is difficult. Hence, the above-described techniques are unique to an X-ray exposure mask or electron beam exposure mask for a reduction image projection lithography having a structure with a self-supporting film.

Details of the present invention will be described below on the basis of the embodiments.

First Embodiment

FIGS. 5A to 5F and 6G to 6J are sectional views showing steps in manufacturing an X-ray exposure mask according to the first embodiment to the present invention.

Figure 5A:
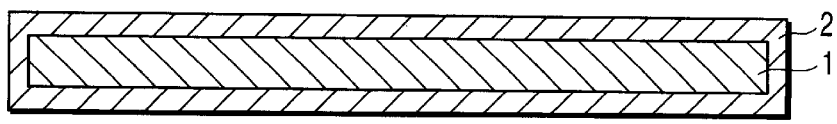
FIGS. 5A to 5F are sectional views showing steps in manufacturing an X-ray exposure mask according to the first embodiment to the present invention.

First, as shown in FIG. 5A, setting the substrate temperature to 1,025° C. and pressure to 30 Torr, 10% hydrogen-diluted silane gas at 150 sccm, 10% hydrogen-diluted acetylene gas at 65 sccm, and 100% hydrogen chloride gas at 150 sccm are supplied into a reaction tube together with hydrogen as a carrier gas at 10 SLM to form a 2-$\mu$m thick SiC film as an X-ray transparent thin film (membrane film) 2 on a cleaned 4"-diameter Si (100) wafer having a thickness of 2 mm using low-pressure CVD.

Figure 5B:
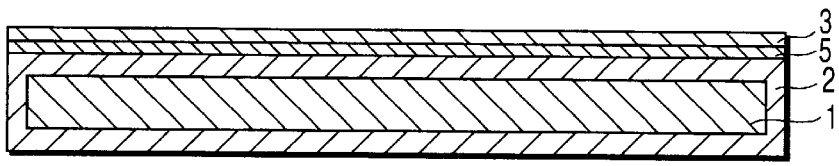

As shown in FIG. 5B, at an Ar pressure of 1 mTorr, a 98-nm thick alumina film serving as an anti-reflection film & etching stopper 5 is formed on the upper surface of the substrate using an RF sputtering apparatus. A 600-nm thick $SiO_2$ film as a patterning layer (transparent film) 3 having high X-ray transparency is formed on the anti-reflection film & etching stopper 5 by CVD using TEOS as a main material and then annealed to adjust stress in the $SiO_2$ film to about 0 to 5 MPa.

Figure 5C:
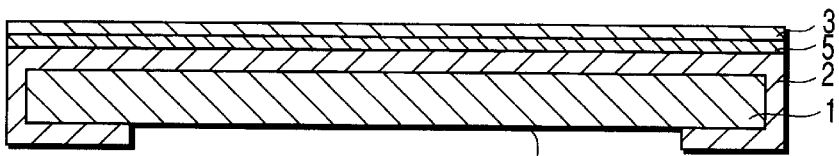

As shown in FIG. 5C, setting the pressure to 10 mTorr and the RF power to 200 W, the SiC film 2 in a region with a radius of 70 mm at the center of the lower surface of the transfer substrate is removed using aluminum as an etching mask by supplying $CF_4$ gas at 25 sccm and $O_2$ gas at 40 sccm using an RIE apparatus, thereby forming an opening region 6 serving as a mask for etching the Si wafer 1.

Figure 5D:
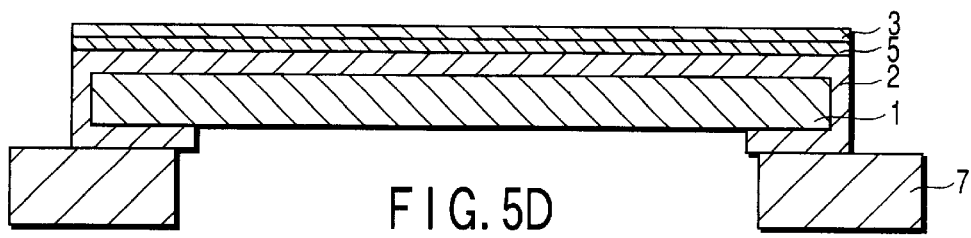
Figure 5E:
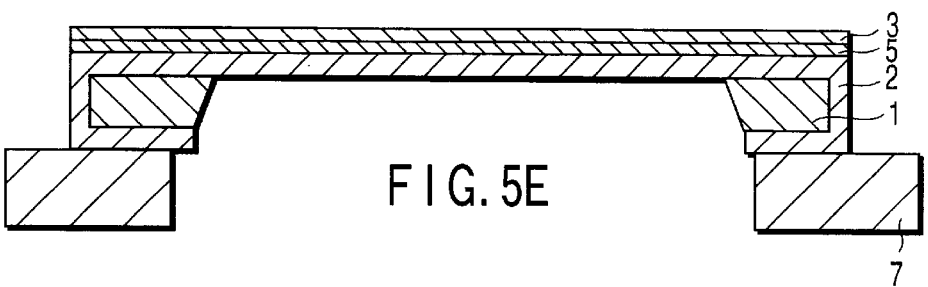

As shown in FIG. 5D, a glass ring having an outer diameter of 125 mm, inner diameter of 72 mm, and thickness of 6.2 mm is bonded as a frame 7 using a UV curing resin. As shown in FIG. 5E, Si is removed by etching using a back etching apparatus by dropping a solution mixture containing hydrofluoric acid and nitric acid at a ratio of 1:1 to the portion where the SiC film 2 is removed.

Figure 5F:
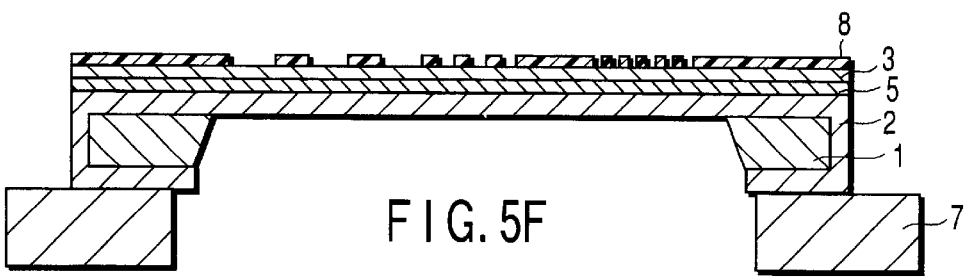

As shown in FIG. 5F, a commercially available electron beam positive resist ZEP520 (viscosity: 12 cps) is coated on the upper surface of the substrate rotating at a rotating speed of 2,000 rpm for 50 sec and baked at 175° C. for two min using a hot plate to form a resist (photosensitive film) 8 having a thickness of 300 nm. A pattern is written on this substrate using an electron beam direct write apparatus at an acceleration voltage of 75 kV. To obtain desired drawing accuracy, multiple-exposure is performed to write the pattern four times. Setting a dose to 96 $\mu C/cm^2$ for a single-exposure, the proximity effect is corrected by dose correction. After e-beam writing, development processing is performed using a commercially available developing solution ZEP-RD at a liquid temperature of 18° C. for one min. Subsequently, the resultant structure is rinsed for one min using MIBK to remove the developing solution.

Figure 6G:
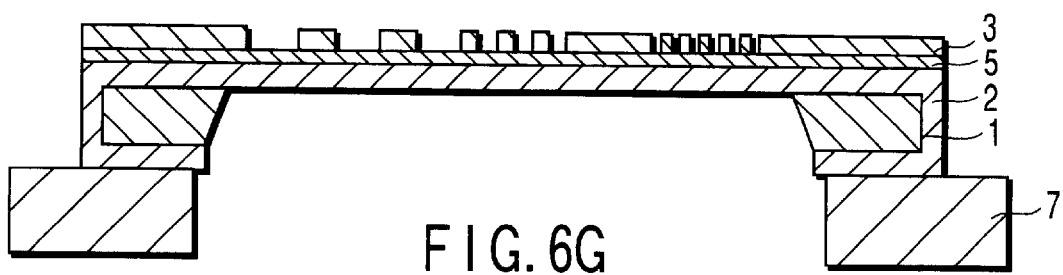
FIGS. 6G to 6J are sectional views showing steps in manufacturing the X-ray exposure mask according to the first embodiment to the present invention.

As shown in FIG. 6G, using the formed resist pattern as a mask, an $SiO_2$ film pattern 2 is fabricated by reactive ion etching using $CHF_3$ gas and CO gas. After the remained resist 8 is ashed in an oxygen plasma and removed, the resultant structure is washed by a solution mixture of sulfuric acid and hydrogen peroxide.

Figure 6H:
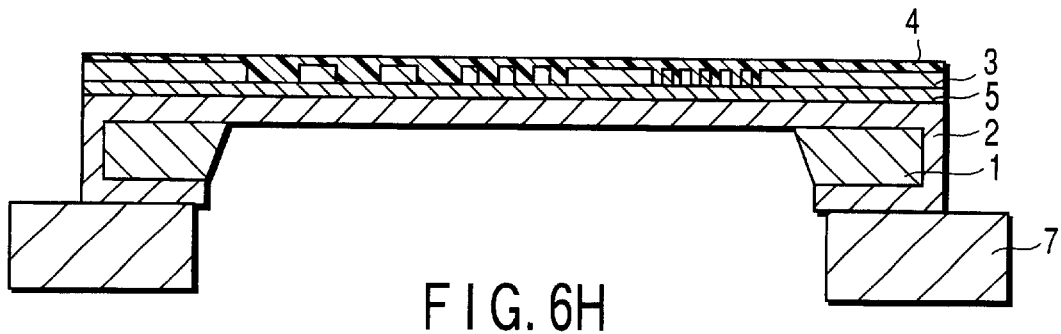

As shown in FIG. 6H, a 0.6-$\mu$m thick copper (Cu) film as an X-ray absorber material 4 is formed using an RF sputtering apparatus at an Ar pressure of 3 mTorr and then annealed to adjust stress in the Cu film to almost 0 MPa.

Figure 6I:
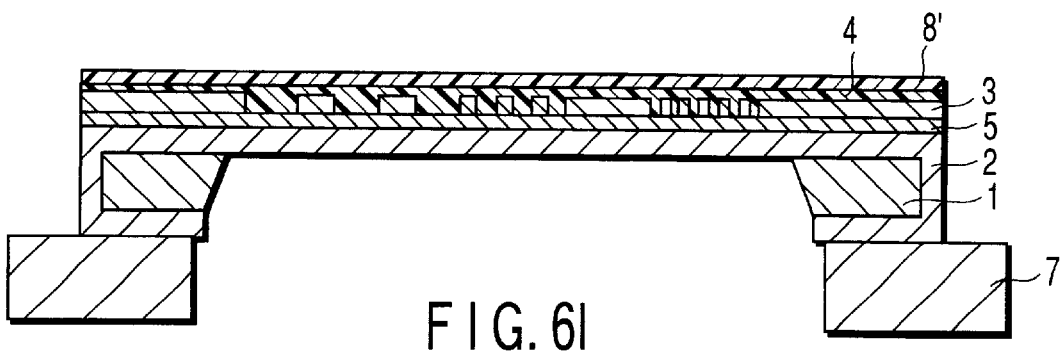

The excessive Cu film portion is removed by the following method called resist etch-back. As shown in FIG. 6I, a commercially available electron beam positive resist ZEP520 (viscosity: 12 cps) is coated on the mask surface using the same apparatus as for previous resist application at a rotating speed of 2,000 rpm for 50 sec and baked at 175° C. for two min using a hot plate to form a resist 81 having a thickness of 300 nm. Because of the characteristics of rotation coating, the surface had an almost flat coat.

Figure 6J:
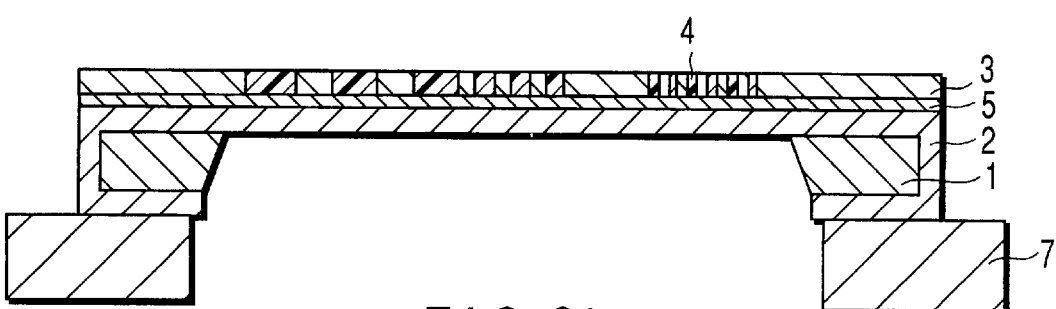

As shown in FIG. 6J, setting conditions under which the etching rates of the resist 8 and Cu are almost equal, the mask surface is etched by reactive ion etching using HBr gas until the $SiO_2$ surface is exposed.

For the X-ray exposure mask manufactured by the above process, the mask pattern layout position is measured using an image placement measurement apparatus (LMS-IPRO available from Leica), and the image placement error in size between the designed pattern position and the formed pattern is checked. The maximum image placement error is 50 nm, and the displacement is 35 nm for 3σ. The displacements occurred almost in one direction (Y direction).

Figure 7A:
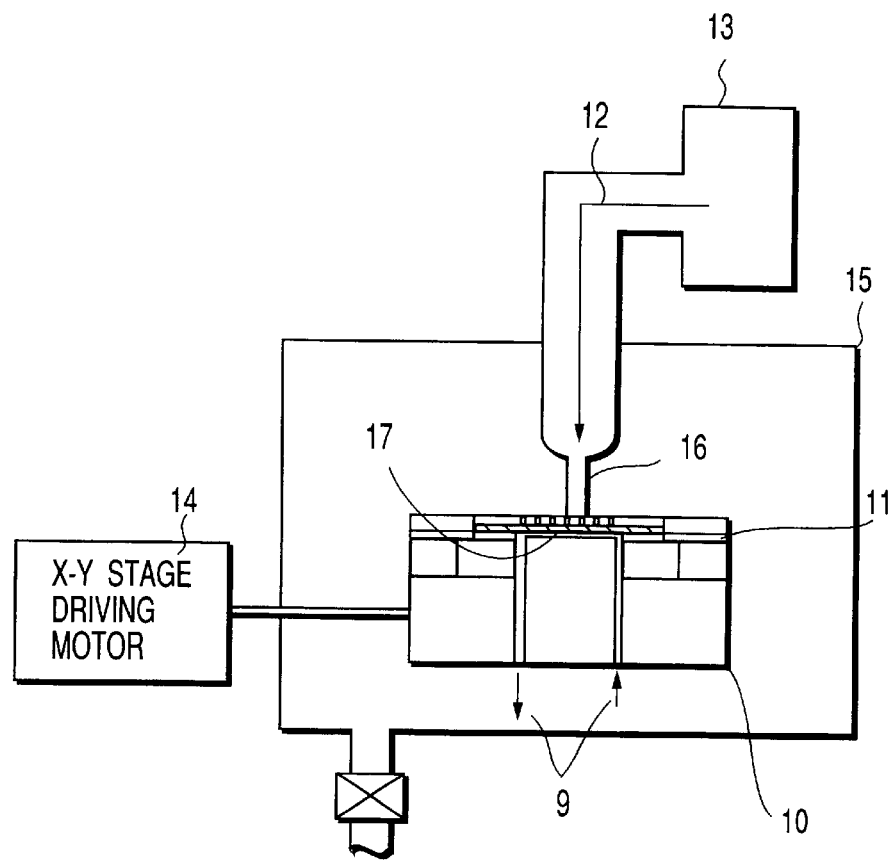
FIGS. 7A and 7B are schematic views showing the arrangement of an etching apparatus used to manufacture the X-ray exposure mask according to the first embodiment to the present invention.
Figure 7B:
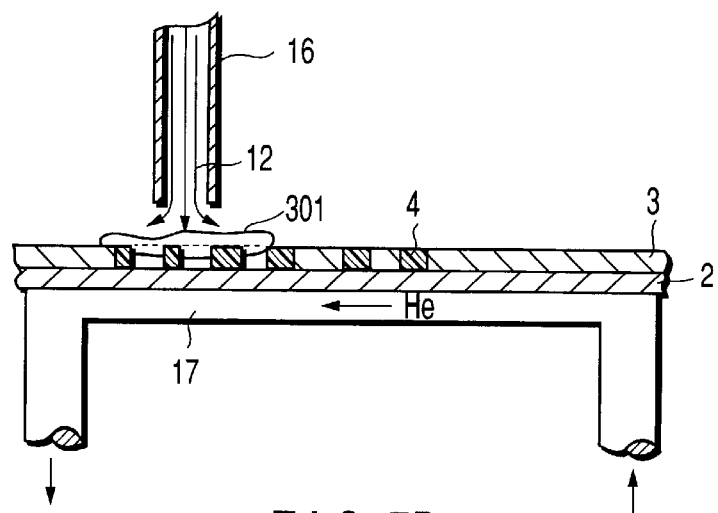

To move and correct part of the formed pattern by a predetermined amount to reduce the positional distortion, the transparent film 3 on the membrane film 2 is partially decreased in thickness by a predetermined amount using an apparatus shown in FIGS. 7A and 7B.

FIG. 7A shows the overall arrangement of an etching apparatus for chemical dry etching. FIG. 7B is an enlarged view near the nozzle. Referring to FIGS. 7A and 7B, reference numeral 9 denotes a cooling gas; 10, a mask holder; 11, a spacer; 12, an etching gas; 13, an etching gas generator; 14, an X-Y stage driving motor; 15, a chamber; 16, a nozzle; and 17, a gap.

Using this apparatus, the X-ray exposure mask is set on the mask holder 10 via the spacer 11 and cooled by the cooling gas 9 flowed to the membrane film surface in the opposite side of the absorber pattern surface. In this state, $CF_4$ gas as the etching gas 12 is supplied from the etching gas generator 13 and sprayed to the upper surface of the X-ray exposure mask through the nozzle 16. At this time, only $SiO_2$ as a transparent film material is selectively etched. An etching amount (film thickness) corresponding to a moving amount necessary for each pattern is calculated. The amount is also determined in consideration of the influence on the CD (Critical Dimension) of the pattern.

In this case, the maximum etching amount (film thickness) is set to 40 nm, and the maximum displacement amount is set to 50 nm. As for degradation in CD uniformity of the pattern in the etching region, pattern-transfer by X-ray lithography with a gap of 10 μm confirmed that the variation amount for an L/S (line and space) pattern with a size of 100 nm is 1.5 nm or less and had very small influence.

Figure 8:
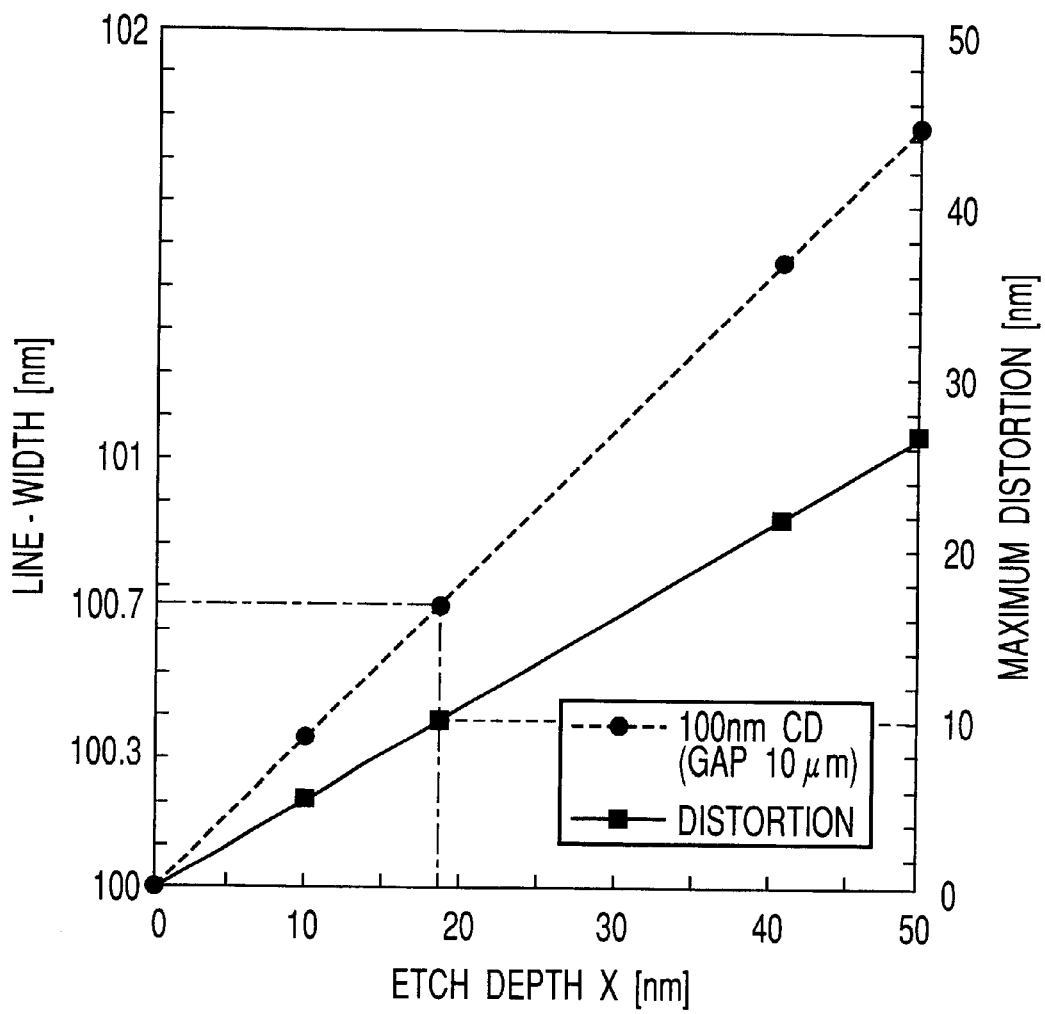
FIG. 8 is a graph showing variation amounts of the pattern position and pattern size with respect to the etching amount of a transparent film in the etching apparatus used to manufacture the X-ray exposure mask according to the first embodiment to the present invention.

FIG. 8 shows another result obtained by measuring the variation amount of the pattern position with respect to the etching amount of the $SiO_2$ film and the transferred pattern size. As is apparent from FIG. 8, the position variation amount and pattern size changed in proportion to the etching amount. The variation amount of size is also suppressed to 2% or less even when the etching amount is 50 nm (position variation amount is 28 nm). The reason for this is as follows. When a material such as an $SiO_2$ film is used as a transparent film, removal of the transparent film rarely influences the pattern size because the transparency is relatively high. In the conventional membrane film, the position variation amount relative to the etching amount becomes large because stress in the membrane film is as high as several hundred MPa. However, in the transparent film such as an $SiO_2$ film used in the first embodiment, the variation amount relative to the etching amount is small because the film had stress as low as about 5 MPa, revealing that the technique is suitable to increase the image placement accuracy. Hence, when a mask is corrected using this technique, a highly precised mask with good image placement and CD can be manufactured.

Figure 9:
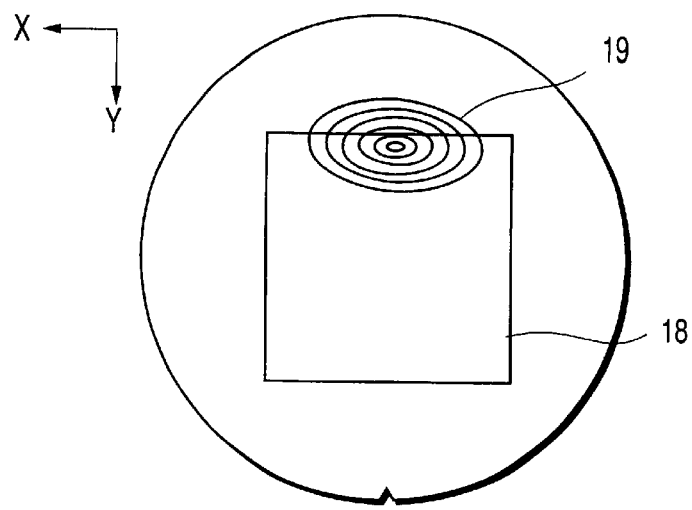
FIG. 9 is a schematic view showing the distribution of etching in the mask by the etching apparatus shown in FIG. 7.

The apparatus shown in FIGS. 7A and 7B has a function of enabling etching at the respective coordinate positions using time control while scanning the mask by controlling the X-Y stage driving motor 14 for driving the X-Y stage, and can adjust the size of the etching region 301 by the nozzle 16. FIG. 9 shows an etching region 19 fabricated by this etching apparatus. Thus, control and fabrication are performed such that the positional distortion in the Y direction is reduced, and a desired mask pattern layout position is obtained, thereby improving the image placement accuracy of the exposure mask.

When the pattern layout position of the mask manufactured by the above process is measured by the wafer coordinate measurement apparatus and evaluated by comparing the pattern with designed pattern data, the maximum positional distortion amount is 14 nm, and the displacement is 10 nm for 3σ.

Second Embodiment

The second embodiment of the present invention will be described next in detail.

The pattern layout position of an X-ray exposure mask manufactured by the same process as in the first embodiment is measured using a wafer coordinate measurement apparatus (LMS-IPRO available from Leica) and evaluated by comparing the pattern with designed pattern data. The maximum image placement error is 60 nm, and the displacement is 30 nm for 3σ. The displacements occurred almost in one direction.

Figure 10:
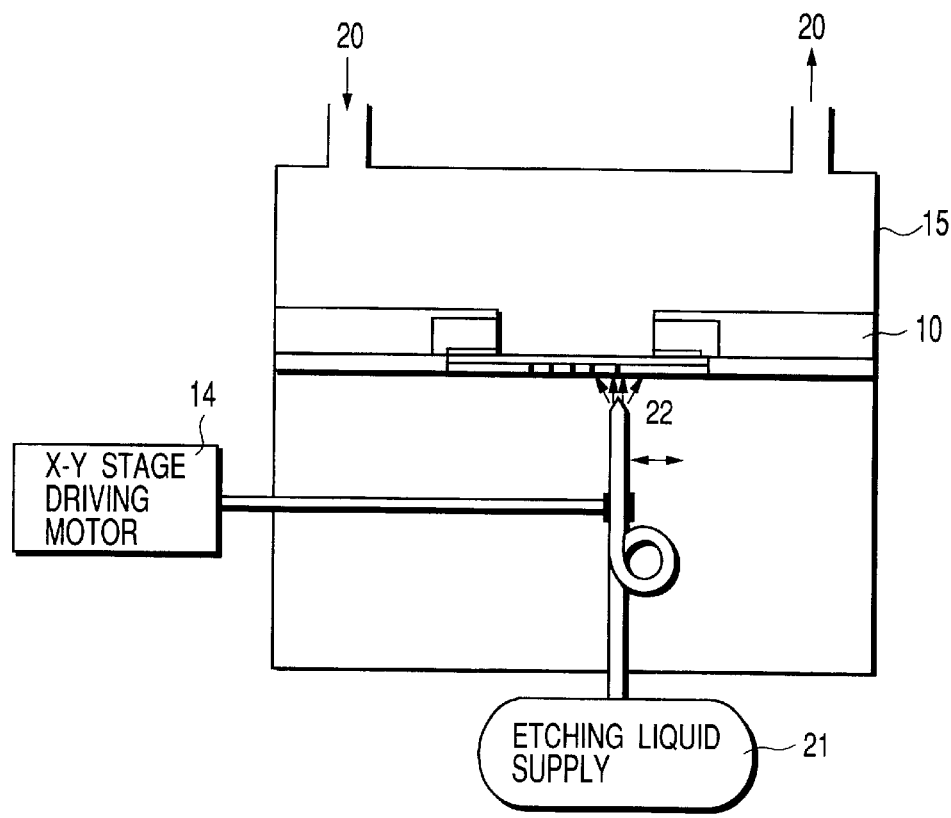
FIG. 10 is a schematic view showing the arrangement of an etching apparatus used to manufacture an X-ray exposure mask according to the second embodiment to the present invention.

To move and correct the pattern position by a predetermined amount, a liquid phase wet etching apparatus shown in FIG. 10 is used. Referring to FIG. 10, reference numeral 10 denotes a mask holder; 14, an X-Y stage driving motor; 15, a chamber; 20, cooling water; 21, an etching liquid supply; and 22, an etching liquid. As the etching liquid, 49% HF solution is used. The membrane film 2 is supplied and sprayed from one spray nozzle to a desired region to be etched. Only $SiO_2$ as a transparent film material is selectively etched. An etching amount (film thickness) corresponding to a moving amount necessary for each pattern is calculated. The amount is also determined in consideration of the influence on the CD of the pattern.

This apparatus also has a function of enabling etching at the respective coordinate positions using time control while scanning the mask by controlling the X-Y stage driving motor 14 for driving the X-Y stage, and can adjust the size of the etching region by the nozzle. Thus, the formed pattern is moved and corrected to the designed pattern layout position, thereby improving the image placement accuracy.

When the pattern layout position of the mask manufactured by the above process is measured by the wafer coordinate measurement apparatus and evaluated by comparing the pattern with designed pattern data, the maximum positional distortion amount is 18 nm, and the displacement is 10 nm for 3σ.

Third Embodiment

The third embodiment of the present invention will be described next in detail.

The pattern layout position of a mask manufactured by the same process as in the first embodiment is measured using a wafer coordinate measurement apparatus (LMS-IPRO available from Leica) and evaluated by comparing the pattern with designed pattern data. As shown in FIG. 11A, the maximum image placement error is 70 nm, and the displacement is 30 nm for 3σ. Almost all the displacements occurred toward the center of the mask.

To move and correct part of the formed pattern by a predetermined amount, an ion implantation apparatus shown in FIG. 11B is used. Referring to FIG. 11B, reference numeral 9 denotes a cooling gas; 10, a mask holder; 11, a spacer; 14, an X-Y stage driving motor; 15, a chamber; 17, a gap; 23, ions; and 24, an aperture.

To reduce positional distortion, Ar ions are implanted into the central portion of a membrane film located at the pattern portion in the central region at an energy of 180 keV and a dose of $1 \times 10^{15}$ cm$^{-2}$ through the aperture 24 having an X-Y driving function. This relaxed by about 10% internal stress of the transparent film and absorber film in the central region where the pattern is formed. Thus, the formed pattern is moved and corrected to the designed pattern layout position, thereby improving the image placement accuracy.

When the pattern layout position of the mask manufactured by the above process is measured by the image placement measurement apparatus and evaluated by comparing the pattern with designed pattern data, the maximum positional distortion amount is 30 nm, and the displacement is 20 nm for 3σ.

Fourth Embodiment

The fourth embodiment of the present invention will be described next in detail.

The pattern layout position of a mask manufactured by the same process as in the first embodiment is measured using a wafer coordinate measurement apparatus (LMS-IPRO available from Leica) and evaluated by comparing the pattern with designed pattern data. As shown in FIG. 12A, the maximum image placement error is 60 nm, and the displacement is 28 nm for 3σ. The displacements occurred almost in one direction.

To move and correct part of the formed pattern by a predetermined amount, a magnetron sputtering apparatus shown in FIG. 12B is used. Referring to FIG. 12B, reference numeral 9 denotes a cooling gas; 10, a mask holder; 11, a spacer; 14, an X-Y stage driving motor; 15, a chamber; 16, a nozzle; 17, a gap; 24, an aperture; and 25, sputtering particles.

To reduce positional distortion, a second transparent SiO$_2$ film having compression stress is formed only in a desired region on the surface of the absorber and transparent film pattern through the aperture 24 having an X-Y driving function. A deposition amount (film thickness) corresponding to a moving amount necessary for each pattern is calculated. The amount is also determined in consideration of the influence on the CD of the pattern. Thus, the formed pattern is moved and corrected to a designed pattern layout position, thereby improving the position accuracy.

When the pattern layout position of the mask manufactured by the above process is measured by the image placement measurement apparatus and evaluated by comparing the pattern with designed pattern data, the maximum positional distortion amount is 30 nm, and the displacement is 20 nm for 3σ.

As in the first to fourth embodiments, the image placement accuracy becomes considerably high. This is because, on the basis of the result of comparison/evaluation with designed pattern data after manufacturing the mask, the film thickness or stress of the transparent film pattern is controlled by the modification such that stress distribution for reducing degradation in position accuracy on the mask is obtained in accordance with the positional distortion amount of each pattern. Since only the transparent film on the membrane film is modified, various characteristics (absorption characteristic, phase characteristic, and shape) of the X-ray absorber pattern portion with respect to X-rays are maintained in the state before modification, and the CD uniformity of the pattern is also maintained. For this reason, a mask excellent not only in image placement accuracy but also CD uniformity can be manufactured.

According to the first to fourth embodiments, in manufacturing a mask, positional distortion in a mask that does not meet the requirement for the image placement accuracy is reduced by modifying the transparent film portion on the membrane film, thereby manufacturing an X-ray exposure mask having a very high image placement accuracy. With this advantage, since the productivity of accurate masks improves, and cost of the mask manufacturing process can be reduced, inexpensive semiconductor devices or optical elements can be supplied.

Fifth Embodiment

As the fifth embodiment of the present invention, a method of manufacturing an electron beam exposure mask for a reduction image projection lithography or SCALPEL mask will be described in detail. FIGS. 13A to 13E are sectional views showing steps in manufacturing a SCALPEL mask used in the fifth embodiment.

Figure 1:
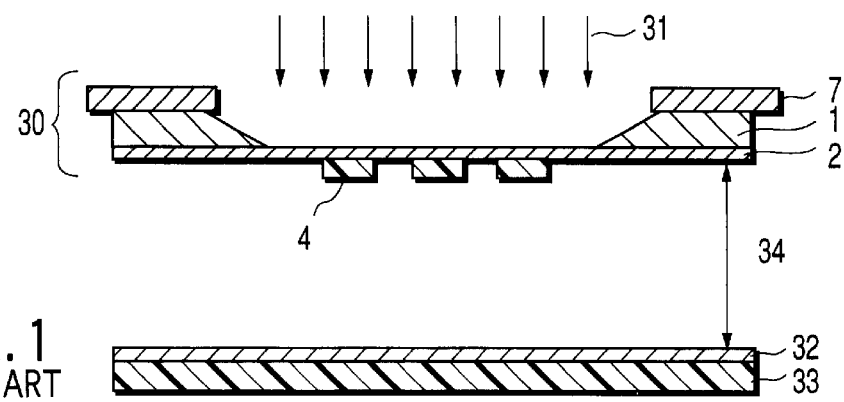
FIG. 1 is a view showing conventional X-ray exposure.
Figure 2:
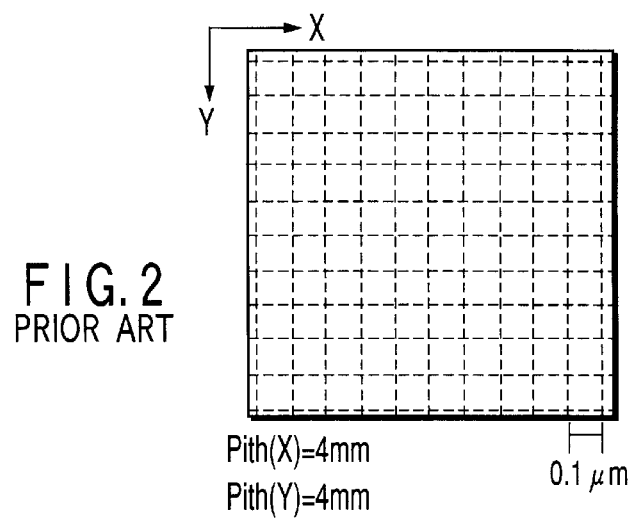
FIG. 2 is a view schematically showing displacements of a mask pattern due to internal stress.
Figure 3A:
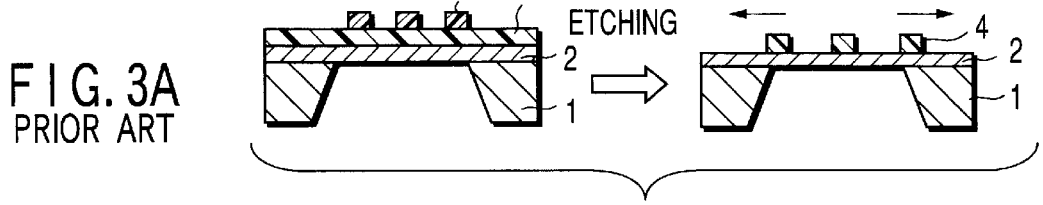
FIGS. 3A and 3B are explanatory views showing positional distortions generated upon etching an X-ray absorber in the prior art.
Figure 3B:
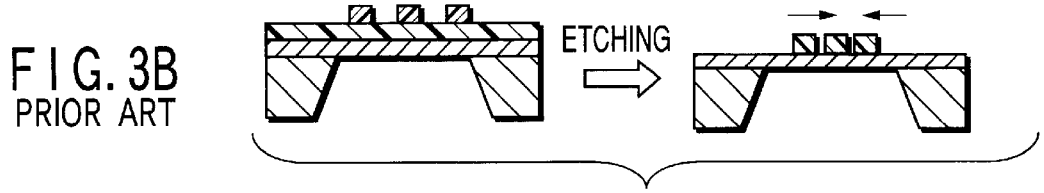

First, as shown in FIG. 3A, a 150- to 200-nm thick SiN$_x$ film as a membrane film 52 is formed on a cleaned 4"-diameter Si (100) substrate 51 having a thickness of 1 mm using low-pressure CVD. A 50-nm thick boron-doped Si film as a patterning layer (transparent film) 53 is formed by LPCVD and then annealed to adjust stress in the Si film to almost 0 MPa. After that, a grillage structure pattern is formed using an RIE apparatus. Setting the pressure to 10 mTorr and the RF power to 200 W, CF$_4$ gas at 25 sccm and O$_2$ gas at 40 sccm are supplied to remove the SiN$_x$ film on the lower surface of the substrate, thereby forming an opening region 56 serving as a mask in etching the Si wafer.

As shown in FIG. 13B, a commercially available electron beam positive resist ZEP520 (viscosity: 12 cps) is spin-coated on the upper surface and baked at 170° C. for five min using a hot plate to form a resist (photosensitive film) 58. Next, Si is removed by etching using a back etching apparatus by dropping a KOH solution to the portion where the SiN$_x$ film is removed, thereby forming a strut. After washing and rinsing the substrate, a glass ring is bonded to a frame 57 using a UV curing resin.

After that, a pattern is written on this substrate using an electron beam direct-write apparatus at an acceleration voltage of 75 kV. To obtain a desired image placement accuracy, multiple-exposure is performed to write the pattern four times. Setting a dose to 70 $\mu$C/cm$^2$ for a single-exposure, the proximity effect is corrected by dose correction. After writing, development processing is performed using a commercially available developing solution ZEP-RD at a liquid temperature of 18° C. for one min. Subsequently, the resultant structure is rinsed for one min using MIBK to remove the developing solution.

As shown in FIG. 13C, using the formed resist pattern as a mask, the Si film pattern 53 is fabricated by reactive ion etching using CF$_4$ gas and Cl$_2$ (chlorine) gas. After the remained resist is ashed in an oxygen plasma and removed, the resultant structure is washed by a solution mixture of sulfuric acid and hydrogen peroxide.

As shown in FIG. 13D, a 60-nm thick W film as a scattering material 54 is formed using a DC sputtering apparatus and then annealed to adjust stress in the W film to almost 0 MPa.

As shown in FIG. 13E, the excessive W film 54 is removed by resist etch-back, as in the first embodiment.

More specifically, a commercially available electron beam positive resist ZEP520 (viscosity: 12 cps) is spin-coated on the mask surface using the same apparatus as for previous resist application and baked at 175° C. for two min using a hot plate to form a resist film. Next, setting conditions under which the etching rates of the resist film and W are nearly equal, the mask surface is etched by reactive ion etching using HBr gas until the Si surface is exposed.

For the mask manufactured by the above process, the mask pattern layout position is measured using the image placement measurement apparatus (LMS-IPRO available from Leica), and the difference in size between the designed pattern position and the formed pattern is checked. The maximum image placement error is 50 nm, and the displacement is 35 nm for 3σ. The displacements occurred almost in one direction (Y direction).

To move and correct part of the formed pattern by a predetermined amount to reduce the positional distortion, the transparent film on the membrane film is partially decreased in thickness by a predetermined amount using an apparatus shown in FIGS. 7A and 7B. In this case, the maximum etching amount (film thickness) is set to 20 nm, and the maximum displacement amount is set to 30 nm.

When the pattern layout position of the mask manufactured by the above process is measured by the image placement measurement apparatus and evaluated by comparing the pattern with designed pattern data, the maximum positional distortion amount is 14 nm, and the displacement is 10 nm for 3σ.

Sixth Embodiment

The sixth embodiment of the present invention will be described next in detail.

For a SCALPEL mask manufactured by the same process as in the fifth embodiment, the pattern layout position is measured using the image placement measurement apparatus (LMS-IPRO available from Leica) and evaluated by comparing the pattern with designed pattern data. The maximum positional displacement amount is 70 nm, and the displacement is 30 nm for 3σ. The displacements occurred almost in one direction (Y direction).

To move and correct part of the formed pattern by a predetermined amount, an ion implantation apparatus shown in FIG. 11B is used. To reduce positional distortion, B (boron) ions are implanted mainly into the pattern region with the maximum displacement at an energy of 40 keV and a dose of $1 \times 10^{18}$ cm$^{-2}$ through an aperture 24 having an X-Y driving function to change internal stress distribution of the transparent film and absorber film at the central region where the pattern is formed. With this process, the formed pattern is moved and corrected to a desired pattern layout position, thereby improving the image placement accuracy.

In this case, not only improvement of image placement accuracy by the modification of stress distribution but also suppression of degradation in image placement accuracy due to charging in the SiN$_x$ membrane film can be suppressed because the B-doped Si transparent film is a conductive layer. For this reason, the method of implanting ions into the SCALPEL mask to improve the image placement accuracy is very effective.

When the pattern layout position of the mask formed by the above process is measured using the image placement measurement apparatus and evaluated by comparing the pattern with designed pattern data, the maximum positional displacement amount is 30 nm, and the displacement is 20 nm for 3σ.

As described above, according to the fifth and sixth embodiments, in manufacturing a mask, positional distortion in a mask that does not meet the requirement for the image placement accuracy is reduced by modifying a transparent film 53 portion on a membrane film 52, thereby manufacturing an electron beam exposure mask having a very high image placement accuracy. With this advantage, since the productivity of accurate masks improves, and cost of the mask manufacturing process can be reduced, inexpensive semiconductor devices or optical elements can be supplied.

Seventh Embodiment

A method of producing a microdevice using an exposure mask manufactured by each of the above embodiments will be described next. A microdevice herein includes a semiconductor chip such as an integrated circuit or ULSI, a liquid crystal device, a micromachine, and a thin-film magnetic head.

A semiconductor device will be exemplified below.

FIG. 14 shows steps in producing a semiconductor device. In step (circuit design) 1-1, the circuit of a semiconductor device is designed by CAD. In step (mask fabrication) 1-2, a mask is fabricated on the basis of the designed circuit pattern. The image placement accuracy of the mask is checked, and the pattern position is corrected by an arbitrary one of the methods of the first to fifth embodiments as needed. This ensures a predetermined accuracy.

In step (wafer fabrication) 1-3, a wafer is fabricated using a material such as silicon. In step (wafer process) 1-4, an actual circuit pattern is formed on the wafer by lithography using the fabricated mask. The wafer process comprises a plurality of processes including a pre-process, resist application, pre-baking, exposure, post-exposure baking (PEP), development, rinsing, post-baking, etching, ion implantation, resist removing, and check.

In step (assembly) 1-5, post-process is performed, and the wafer fabricated in step 1-4 is assembled to manufacture a semiconductor chip. Step 1-5 includes the assembly process (dicing and bonding) and packaging process (chip process). In step (check/correction) 1-6, the semiconductor device manufactured in step 1-5 is checked by operation confirmation test and durability confirmation test and corrected. With these processes, a semiconductor device is completed and is shipped (step 1-7).

According to the production method of this embodiment, the transfer/exposure process can be executed at low cost by using an inexpensive exposure mask, so inexpensive semiconductor devices or optical elements can be supplied.

Modifications

The present invention is not limited to the above-described embodiments. The first to fourth embodiments may be appropriately combined. The transparent film thickness and stress control method for an X-ray exposure mask according to the first to fourth embodiments may be combined with the SCALPEL mask of the fifth or sixth embodiment.

Also, the resist of the semiconductor device is not limited to ZEP-520, and SAL-601 (available from Shipley) or TDUR-N9TR4 (available from Tokyo Ohka Kogyo) may be used. The X-ray absorber is not limited to Cu, and Ni, Zn, Ga, Ge, W, Ta, Au, Re, or a Cu-nitride, a Ni-nitride, a Zn-nitride, a Ga-nitride, a Ge-nitride, a W-nitride, a Ta-nitride, an Au-nitride, a Re-nitride, a Cu-carbide, a Ni-carbide, a Zn-carbide, a Ga-carbide, a Ge-carbide, a W-carbide, a Ta-carbide, an Au-carbide, a Re-carbide, or alloy thereof may be used. The scattering material is not limited to W, and Ni, Zn, Ga, Ge, W, Ta, Au, Re, or a W-nitride, a Ni-nitride, a Zn-nitride, a Ga-nitride, a Ge-nitride, a W-nitride, a Ta-nitride, an Au-nitride, a Re-nitride, a W-carbide, a Ni-carbide, a Zn-carbide, a Ga-carbide, a Ge-carbide, a W-carbide, a Ta-carbide, an Au-carbide, a Re-carbide, or alloy thereof may be used. For the membrane film as well, not only SiC or $SiN_x$ but also $SiC_xN_y$, BN, or diamond film may be used.

As the transparent film material of the X-ray exposure mask, not only the $SiO_2$ film used in the embodiments but also an SION film may be used. As advantages of use of an SION film, stress control is easy as compared to the $SiO_2$ film, and thermal diffusion of the absorber material Cu can be suppressed. SION is a suitable material for a transparent film pattern layer in the embodiments because Auger electron spectroscopy and Rutherford backscattering spectroscopy have indicated that stress control in forming an SION film is easy, and Cu does not thermally diffuse into the SION film even in annealing at a temperature of 500° C. for 1 hr. Since annealing at a high temperature is possible, an absorber can be embedded into a concave portion with a high aspect ratio without any thermal diffusion and voids, so a highly accurate absorber pattern can be formed.

As a suitable transparent film material, Si, $Si_3N_4$, SiC, $Al_2O_3$, SrO, MgO, $Y_2O_3$, or $TiO_2$ having a high X-ray transparency in a wavelength range of 0.6 to 1.0 nm can also be used. The gases, solutions, and ion implantation materials used for etching the transparent film are also not limited to those used in the above embodiments, and various materials can be used.

As the transparent film material of the electron beam exposure mask, not only the Si film used in the embodiments but also $SiO_2$, $Si_3N_4$, SiC, $Al_2O_3$, SrO, MgO, $Y_2O_3$, $TiO_2$ having a small scattering coefficient with respect to an electron beam, or a material obtained by doping an element with light weight therein can be used. The gases, solutions, and ion implantation materials used for etching the transparent film are also not limited to those used in the above embodiments, and various materials can be used.

As has been described above in detail, according to the above embodiments, a process such as cutting, deposition, or ion implantation is performed for a transparent film pattern formed on a transparent supporting film (membrane film) to accurately correct positional distortion due to internal stress of the X-ray absorber pattern or scattering pattern, thereby realizing an exposure mask having a very high position accuracy. Hence, since the productivity of accurate masks improves, and cost of the mask manufacturing process can be reduced, inexpensive semiconductor devices or optical elements can be supplied.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An exposure mask comprising:
   a transparent base; and
   a transparent film formed on said transparent base, said transparent film having at least one mask member formed in a predetermined mask pattern and having a relatively low exposure beam transparency, and at least one stress changing member changing an in-plane stress distribution of said transparent film.

2. A mask according to claim 1, wherein said transparent film is made of a material selected from the group consisting of $SiO_2$, SiC, SiON, Si, $Si_3N_4$, $Al_2O_3$, SrO, MgO, $Y_2O_3$, and $TiO_2$.

3. A mask according to claim 1, wherein the mask member is made of a material selected from the group consisting of Cu, Ni, Zn, Ga, Ge, W, Ta, Au, Re, a Cu-nitride, a Ni-nitride, a Zn-nitride, a Ga-nitride, a Ge-nitride, a W-nitride, Ta-nitride, an Au-nitride, a Re-nitride, a Cu-carbide, a Ni-carbide, a Zn-carbide, a Ga-carbide, a Ge-carbide, a W-carbide, a Ta-carbide, an Au-carbide, a Re-carbide, and an alloy of at least two materials.

4. A mask according to claim 1, wherein said transparent film is partially decreased in thickness to be said stress charging member.

5. A mask according to claim 1, wherein said stress changing member is a transparent member partially deposited on said transparent film.

6. A mask according to claim 1, wherein said transparent film is partially modified to be said stress changing member.

7. An exposure mask comprising:
   a transparent base; and
   a transparent film formed on said transparent base, said transparent film having at least one mask member formed in a predetermined mask pattern and having a relatively low exposure beam transparency, said transparent film being partially decreased in thickness to change an in-plane stress distribution of said transparent film.

8. A mask according to claim 7, wherein said transparent film is partially decreased in thickness to reduce a placement error of said mask member due to said in-plane stress distribution to substantially not more than 14 nm.

9. An exposure mask comprising:
   a transparent base;
   a transparent film formed on said transparent base, said transparent film having at least one mask member formed in a predetermined mask pattern and having a relatively low exposure beam transparency, and at least one transparent member partially deposited on said transparent film to change an in-plane stress distribution of said transparent film.

10. A mask according to claim 9, wherein said transparent member is made of $SiO_2$.

11. A mask according to claim 9, wherein said transparent member is formed from the same material as that of said transparent film.

12. A mask according to claim 9, wherein said transparent member is partially deposited to reduce a placement error of said mask member due to said in-plane stress distribution to substantially not more than 18 nm.

13. An exposure mask comprising:
   a transparent base;
   a transparent film formed on said transparent base, having at least one mask member formed in a predetermined mask pattern and having a relatively low exposure beam transparency, said transparent film being partially modified to change an in-plane stress distribution of said transparent film.

14. A mask according to claim 13, wherein said transparent film is partially implant ions to change said in-plane stress distribution of said transparent film.

15. A mask according to claim 13, wherein said transparent film is partially doped impurities to change said in-plane stress distribution of said transparent film.

16. A mask according to claim 13, wherein said transparent film is partially modified to reduce a placement error of said mask member due to said in-plane stress distribution to substantially not more than 30 nm.

17. A method of manufacturing a mask, comprising the steps of:

forming a transparent film on a transparent base;

forming a mask member in said transparent film in a predetermined mask pattern; and partially decreasing in thickness said transparent film to change an in-plane stress distribution of said transparent film.

18. A method of manufacturing a mask, comprising the steps of:

forming a transparent film on a transparent base;

forming a mask member in said transparent film in a predetermined mask pattern; and partially depositing at least one transparent member on said transparent film to change an in-plane stress distribution of said transparent film.

19. A method of manufacturing a mask, comprising the step of:

forming a transparent film on a transparent base;

forming a mask member in said transparent film in a predetermined mask pattern; and partially modifying said transparent film to change an in-plane stress distribution of said transparent film.

20. A method of manufacturing a semiconductor device, comprising the steps of:

preparing a wafer using a predetermined material;

forming the circuit pattern on the wafer by lithography using an exposure mask, said exposure mask comprising a transparent base and a transparent film formed on said transparent base, said transparent film having at least one mask member formed in a predetermined chip pattern and having a relatively low exposure beam transparency, and at least one stress changing member changing an in-plane stress distribution of said transparent film; and dividing said wafer into semiconductor chips.

* * * * *